US012564063B2

(12) United States Patent
Liao et al.

(10) Patent No.: US 12,564,063 B2
(45) Date of Patent: Feb. 24, 2026

(54) PACKAGE-LEVEL ESD PROTECTION

(71) Applicant: MEDIATEK INC., Hsin-Chu (TW)

(72) Inventors: Yu-Cheng Liao, Hsinchu (TW);
Bo-Shih Huang, Hsinchu (TW);
Che-Yuan Jao, Hsinchu (TW);
Yi-Chieh Lin, Hsinchu (TW)

(73) Assignee: MEDIATEK INC., Hsinchu (TW)

( * ) Notice: Subject to any disclaimer, the term of this
patent is extended or adjusted under 35
U.S.C. 154(b) by 623 days.

(21) Appl. No.: 17/902,912

(22) Filed: Sep. 5, 2022

(65) Prior Publication Data

US 2023/0138324 A1     May 4, 2023

Related U.S. Application Data

(60) Provisional application No. 63/274,032, filed on Nov.
1, 2021.

(51) Int. Cl.
| | |
|---|---|
| *H01L 23/60* | (2006.01) |
| *H01L 23/00* | (2006.01) |
| *H01L 23/31* | (2006.01) |
| *H01L 23/498* | (2006.01) |

(52) U.S. Cl.
CPC .......... *H01L 23/60* (2013.01); *H01L 23/3128*
(2013.01); *H01L 23/49816* (2013.01); *H01L
24/16* (2013.01); *H01L 2924/15311* (2013.01)

(58) Field of Classification Search
CPC ........ H01L 23/60; H05G 1/48; G02B 6/4275;
G05B 2219/14116; G03F 1/40; G01R 29/0814; G01R 31/001; G01R 31/12;
H05K 1/0259; H05K 9/0079; H10D
89/921; H10D 89/60; H10D 84/148;
H01R 13/7031

See application file for complete search history.

(56) References Cited

U.S. PATENT DOCUMENTS

| | | | |
|---|---|---|---|
| 5,859,758 A | 1/1999 | Kim | |
| 8,264,070 B2 | 9/2012 | Tsai et al. | |
| 8,482,072 B2 | 7/2013 | Drost et al. | |
| 8,723,257 B2 | 5/2014 | Lin et al. | |
| 9,601,920 B2 | 3/2017 | Glas et al. | |
| 2006/0250731 A1 | 11/2006 | Parkhurst et al. | |
| 2008/0185586 A1* | 8/2008 | Lin ......................... | H01L 25/50 |
| | | | 257/E21.705 |
| 2011/0211289 A1* | 9/2011 | Kosowsky ........... | H10D 89/911 |
| | | | 361/91.1 |
| 2012/0162834 A1 | 6/2012 | Yehezkely | |
| 2015/0188312 A1 | 7/2015 | Kwok | |
| 2016/0372427 A1 | 12/2016 | Altunkilic | |
| (Continued) | | | |

FOREIGN PATENT DOCUMENTS

| | | |
|---|---|---|
| CN | 1897785 B | 7/2012 |
| EP | 0643422 B1 | 2/2002 |
| (Continued) | | |

*Primary Examiner* — Lawrence C Tynes, Jr.

(74) *Attorney, Agent, or Firm* — Winston Hsu

(57) ABSTRACT

The present invention provides a package including a first
pad, a die and at least one package ESD component is
disclosed. The first pad is configured to receive a signal from
a device external to the package. The die comprises a second
pad and an internal circuit, wherein the internal circuit is
configured to receive the signal from the first pad via the
second pad. The at least one ESD component is positioned
outside the die.

8 Claims, 13 Drawing Sheets

(56)                    References Cited

U.S. PATENT DOCUMENTS

2018/0204831  A1       7/2018  Seidemann
2020/0014200  A1       1/2020  Peng et al.
2020/0020651  A1       1/2020  Kurashima
2020/0235062  A1*      7/2020  Sasaki ..................... H03F 3/195

FOREIGN PATENT DOCUMENTS

EP            3007232  A1      4/2016
TW           200536097  A      9/2005
WO         2011/149989  A1     12/2011

* cited by examiner

PACKAGE-LEVEL ESD PROTECTION

CROSS REFERENCE TO RELATED APPLICATIONS

This application claims the benefit of U.S. Provisional Application No. 63/274,032, filed on Nov. 1, 2021. The content of the application is incorporated herein by reference.

BACKGROUND

In order to protect circuits of a die from being damaged by electrostatic discharge (ESD), one or more ESD protection circuits are designed within the die to pass a human body model (HBM) and charged device model (CDM) of ESD specifications. However, the die-level ESD protection circuits generally have higher parasitic effects; and if the die-level ESD protection circuits are designed with smaller size to lower the parasitic effects, the die-level ESD protection circuits will not have good ESD robustness for high-speed radio-frequency (RF) designs.

SUMMARY

It is therefore an objective of the present invention to provide a package-level ESD design, which has lower parasitic effects and better ESD robustness, to solve the above-mentioned problems.

According to one embodiment of the present invention, a package comprising a first pad, a die and at least one package ESD component is disclosed. The first pad is configured to receive a signal from a device external to the package or transmit a signal from an internal circuit to the device external to the package. The die comprises a second pad and the internal circuit, wherein the internal circuit is configured to receive the signal from the first pad via the second pad or transmit the signal from the internal circuit to the first pad via the second pad. The at least one ESD component is positioned outside the die.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
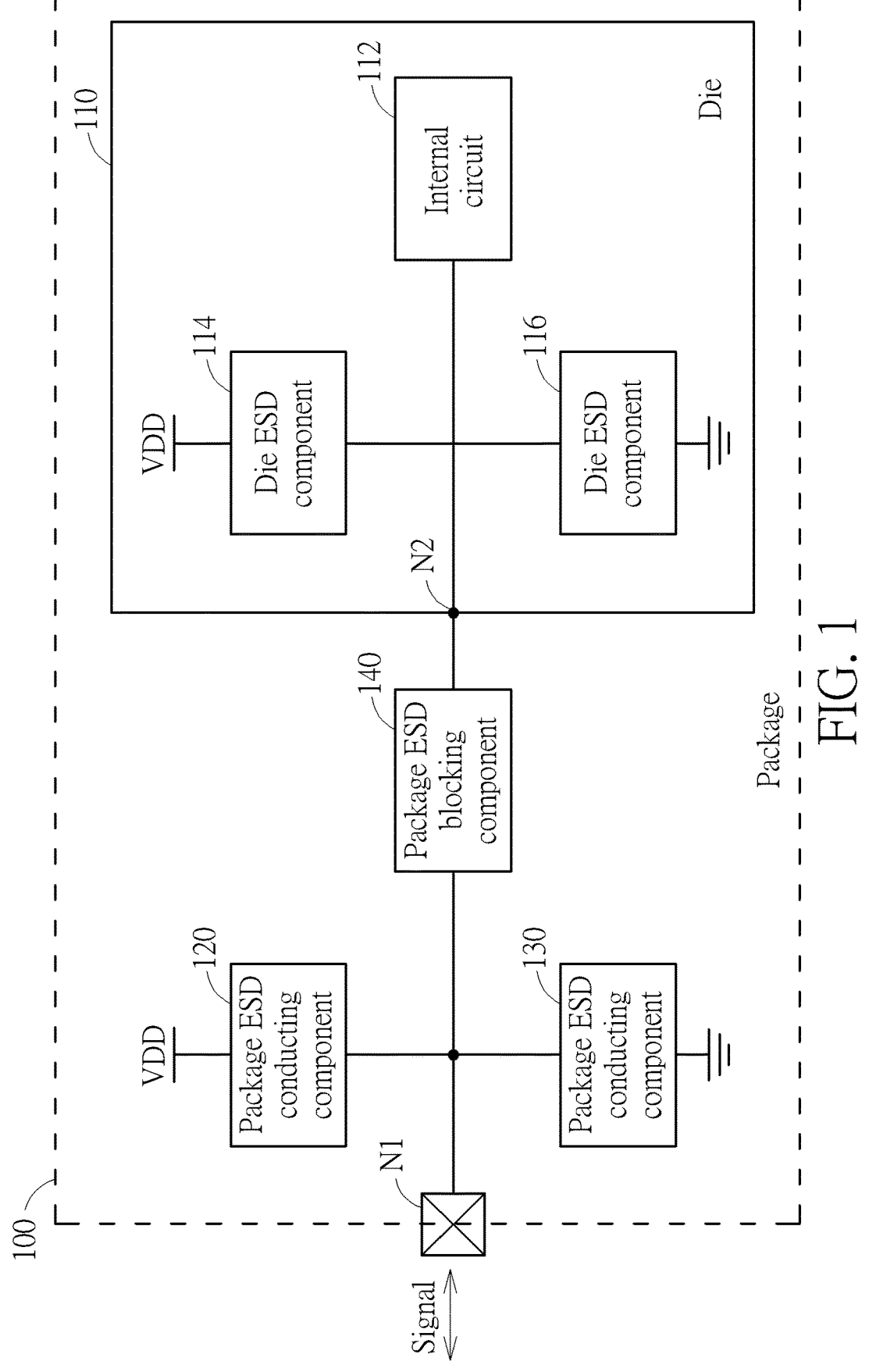
FIG. 1 is a diagram illustrating a package according to one embodiment of the present invention

FIG. 1 is a diagram illustrating a package 100 according to one embodiment of the present invention, wherein the package 100 can be any integrated circuit (IC) package such as chip-on-wafer-on-substrate (CoWoS), integrated fan out (InFO) or any other two-dimensional IC package or three-dimensional IC package. As shown in FIG. 1, the package 100 comprises a die 110, a package ESD conducting component 120, a package ESD conducting component 130, a package ESD blocking component 140 and a plurality of pads (a pad N1 serves as an example), wherein the die 110 comprises a plurality of pads (a pad N2 serves as an example), an internal circuit 112, a die ESD component 114 and a die ESD component 116. In this embodiment, the pad N1 may be a pin or one of a ball grid array (BGA), and the pad N1 is used to receive a signal from a device outside the package 100, or the pad N1 is used to transmit a signal from the internal circuit 112 to the device outside the package 100. The package ESD conducting component 120 is coupled between a supply voltage VDD and the pad N1, the package ESD conducting component 130 connected between a ground voltage and the pad N1, and the package ESD blocking component 140 is coupled between the pad N1 and the pad N2. In addition, the die ESD component is coupled between the supply voltage VDD and the pad N2, the die ESD component is coupled between the ground voltage and the pad N2, and the internal circuit 112 is configured to receive and process the signal from the pad N1 via the package ESD blocking component 140 and the pad N2.

In the embodiment shown in FIG. 1, three package ESD components are designed within the package 100 to protect the internal circuit 112 against the ESD damage, however, the number and type of package ESD components are not limitations of the present invention. In another embodiment, one or two of the package ESD conducting component 120, the package ESD conducting component 130 and the package ESD blocking component 140 can be removed from the package 100.

By designing the package ESD components between the pad N1 and the die 110, most of the ESD current can be bypassed by the package ESD conducting component 130 or blocked by the package ESD blocking component 140, so the remaining ESD current flowing into the die 110 will only induce small voltage drop, and package 100 can meet the requirements of the ESD specifications for high-speed RF designs. In addition, because the package ESD components with lower parasitic effects have better quality factor control and ESD robustness, the package 100 with the package ESD components will have better performance.

Figure 2:
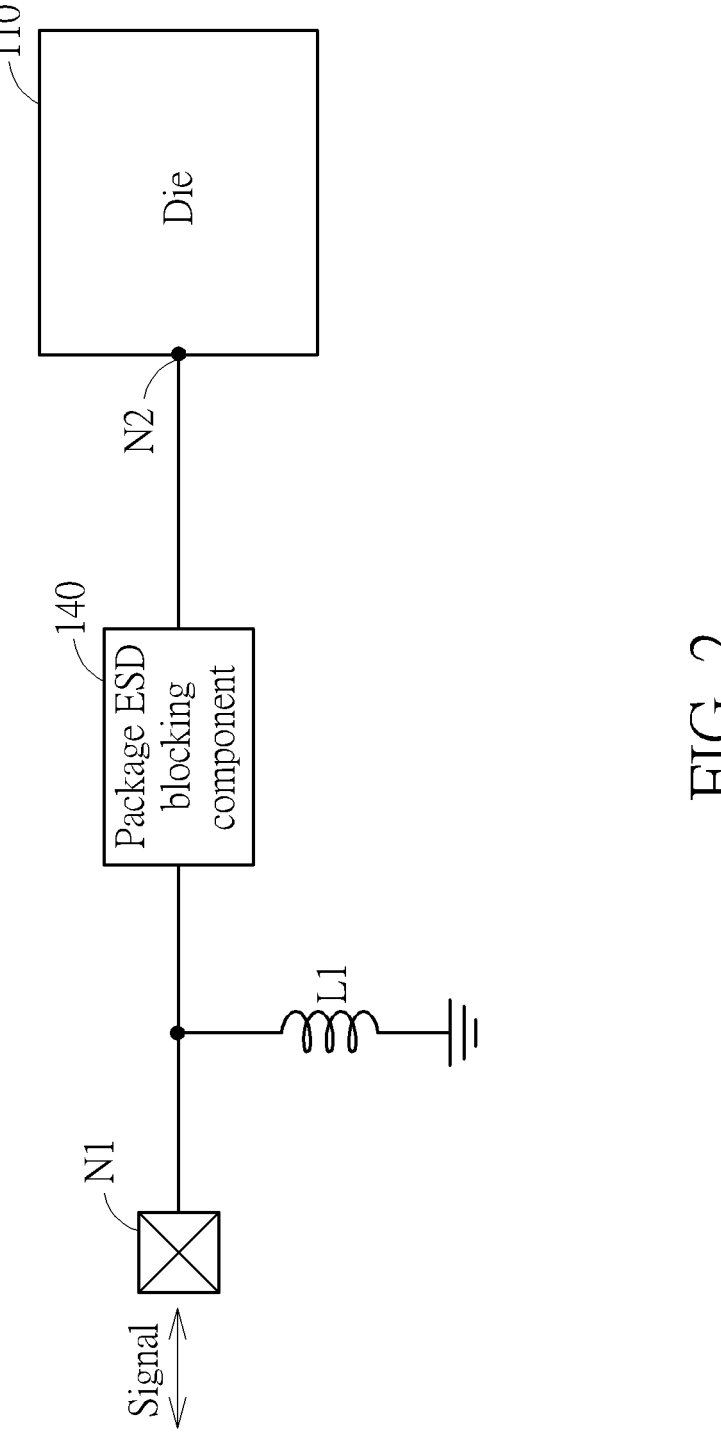
FIG. 2 is a diagram illustrating the package ESD components according to a first embodiment of the present invention.

FIG. 2 is a diagram illustrating the package ESD components according to a first embodiment of the present invention. As shown in FIG. 2, the package 100 comprises the package ESD conducting component 130 and the package ESD blocking component 140, wherein the package ESD conducting component 130 is implemented by using an inductor L1, that is one node of the inductor L1 is coupled to the pad N1, and the other node of the inductor L1 is coupled to the ground voltage.

Figure 3:
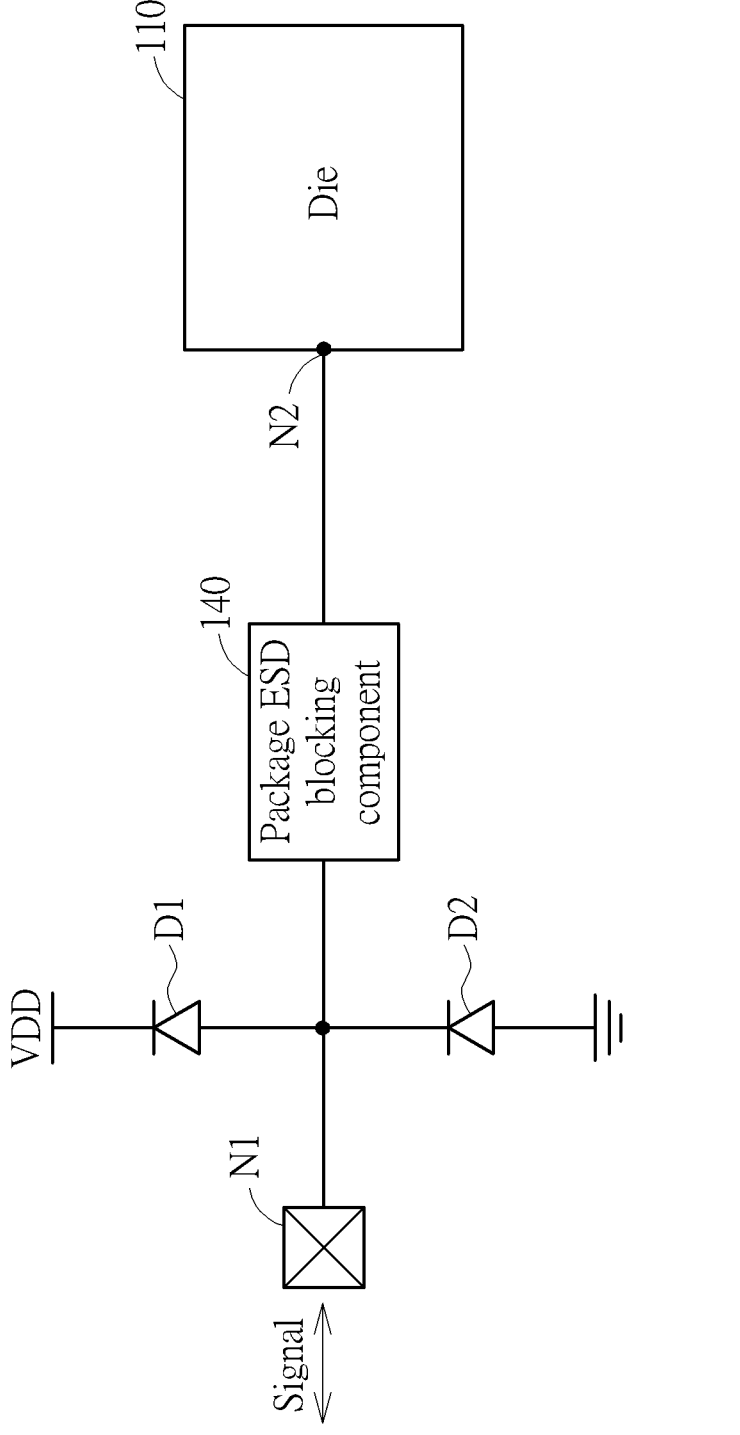
FIG. 3 is a diagram illustrating the package ESD components according to a second embodiment of the present invention.

FIG. 3 is a diagram illustrating the package ESD components according to a second embodiment of the present invention. As shown in FIG. 3, the package 100 comprises the package ESD conducting component 120, the package ESD conducting component 130 and the package ESD blocking component 140. The package ESD conducting component 120 is implemented by using a diode D1, wherein an anode of the diode D1 is coupled to the pad N1, and a cathode of the diode D1 is coupled to the supply voltage VDD. The package ESD conducting component 130 is implemented by using a diode D2, wherein an anode of the diode D2 is coupled to the ground voltage, and a cathode of the diode D2 is coupled to the pad N1.

Figure 4:
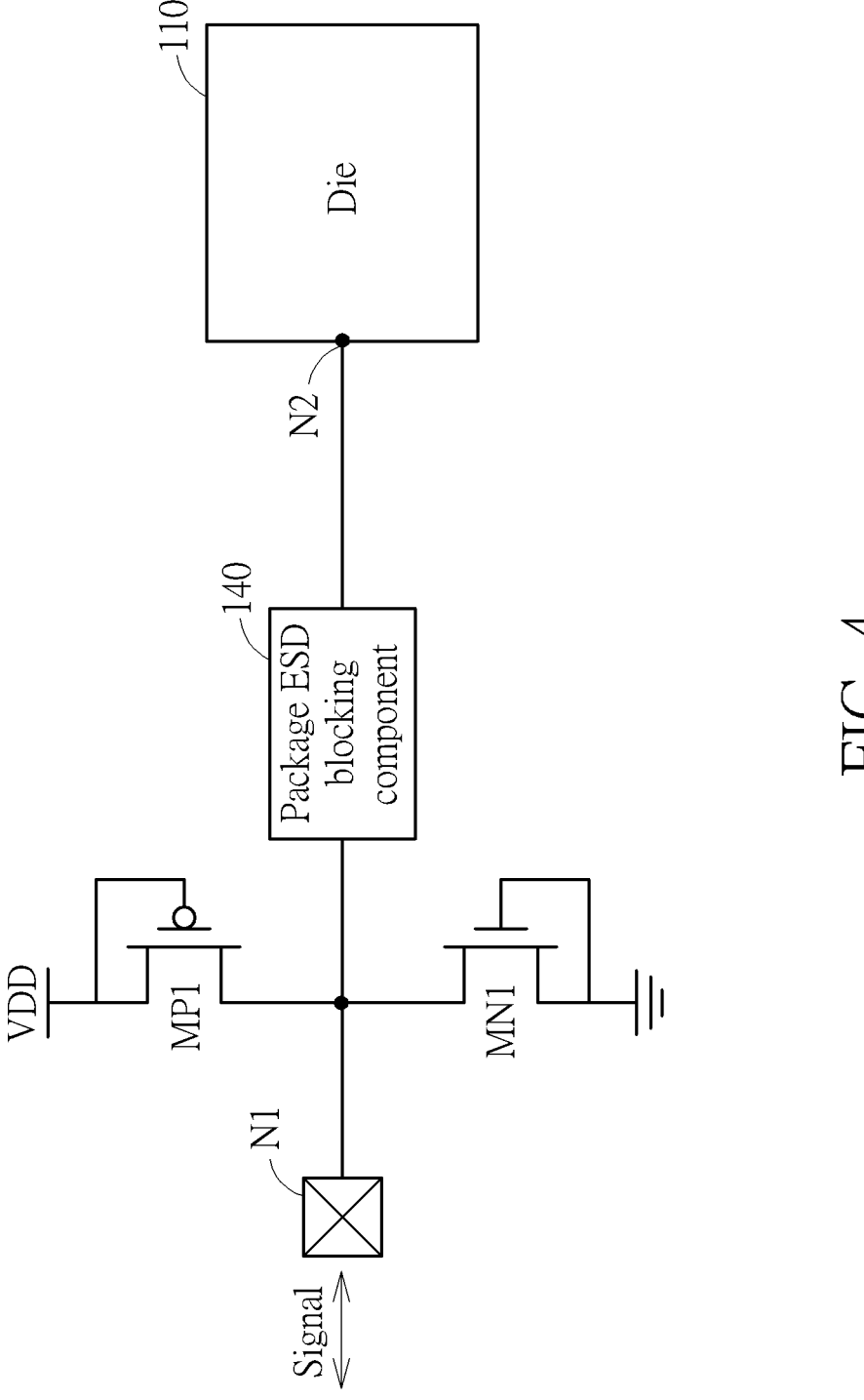
FIG. 4 is a diagram illustrating the package ESD components according to a third embodiment of the present invention.

FIG. 4 is a diagram illustrating the package ESD components according to a third embodiment of the present invention. As shown in FIG. 4, the package 100 comprises the package ESD conducting component 120, the package ESD conducting component 130 and the package ESD blocking component 140. The package ESD conducting component 120 is implemented by using a P-type transistor MP1, wherein a source electrode of the P-type transistor MP1 is coupled to the supply voltage VDD, and a drain electrode of the P-type transistor MP1 is coupled to the pad N1. The package ESD conducting component 130 is implemented by using an N-type transistor MN1, wherein a source electrode of the N-type transistor MN1 is coupled to the ground voltage, and a drain electrode of the N-type transistor MN1 is coupled to the pad N1.

Figure 5:
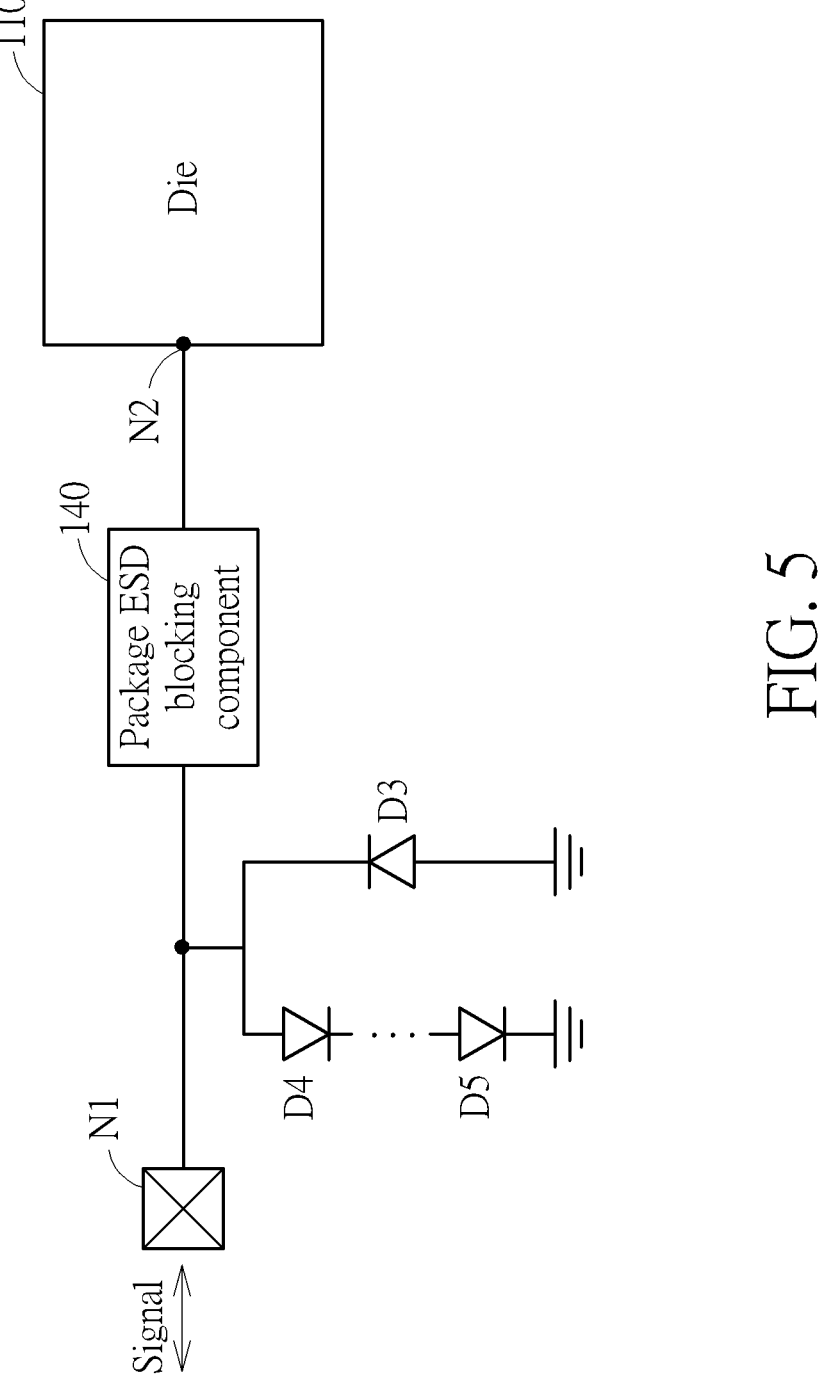
FIG. 5 is a diagram illustrating the package ESD components according to a fourth embodiment of the present invention.

FIG. 5 is a diagram illustrating the package ESD components according to a fourth embodiment of the present invention. As shown in FIG. 5, the package 100 comprises the package ESD conducting component 130 and the package ESD blocking component 140. The package ESD conducting component 130 is implemented by using forward diode (s) D4 and D5 and reverse diode(s) D3. An anode of the diode D3 is coupled to the ground voltage, and a cathode of the diode D3 is coupled to the pad N1. The diodes D4 and D5 are connected in series, wherein an anode of the diode D4 is coupled to the pad N1, and a cathode of the diode D5 is coupled to the ground voltage.

Figure 6:
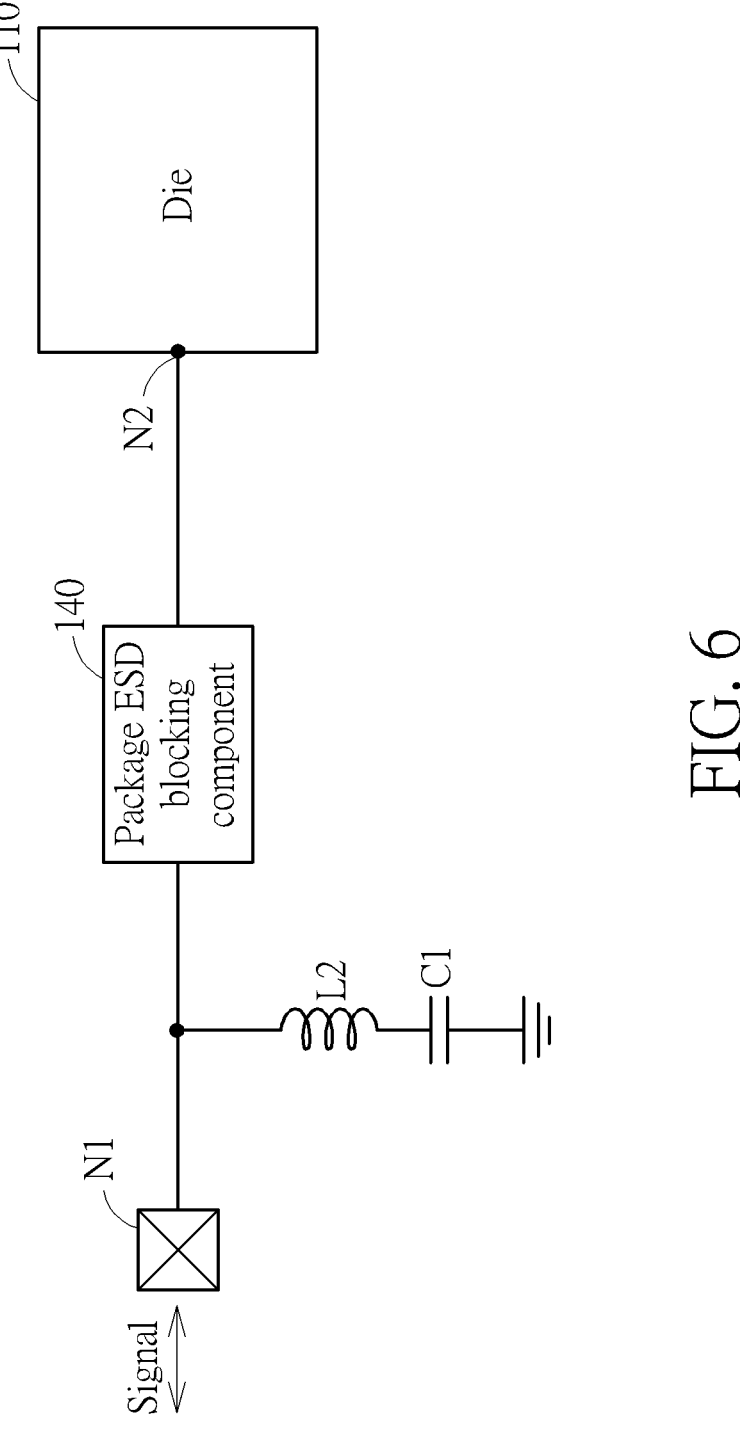
FIG. 6 is a diagram illustrating the package ESD components according to a fifth embodiment of the present invention.

FIG. 6 is a diagram illustrating the package ESD components according to a fifth embodiment of the present invention. As shown in FIG. 6, the package 100 comprises the package ESD conducting component 130 and the package ESD blocking component 140. The package ESD conducting component 130 is implemented by using an inductor L2 and a capacitor C1 connected in series, wherein a first node of the inductor L2 is coupled to the pad N1, a second node of the inductor L2 is coupled to a first node of the capacitor C1, and a second node of the capacitor C1 is coupled to the ground voltage.

Figure 7:
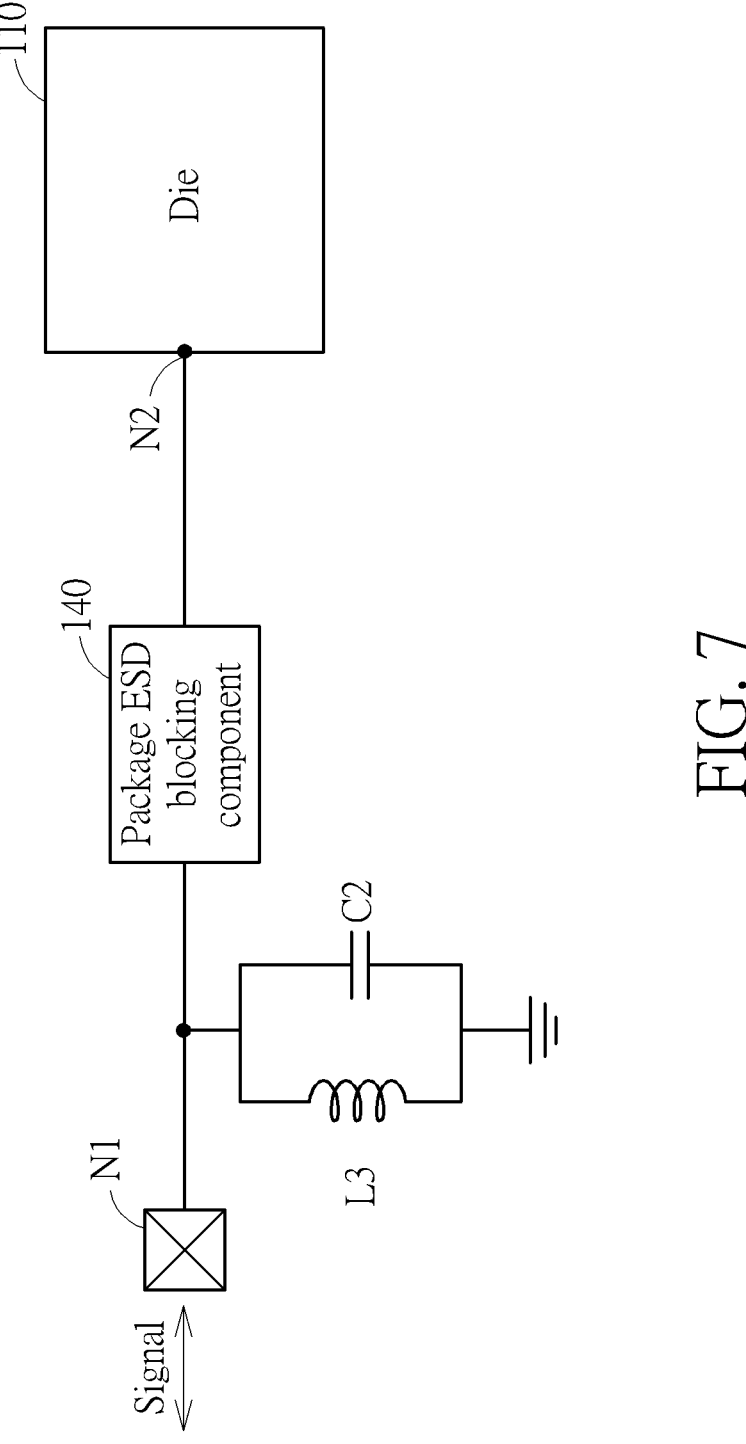
FIG. 7 is a diagram illustrating the package ESD components according to a sixth embodiment of the present invention.

FIG. 7 is a diagram illustrating the package ESD components according to a sixth embodiment of the present invention. As shown in FIG. 7, the package 100 comprises the package ESD conducting component 130 and the package ESD blocking component 140. The package ESD conducting component 130 is implemented by using an inductor L3 and a capacitor C2 connected in parallel, wherein a first node of the inductor L3 is coupled to the pad N1, a second node of the inductor L3 is coupled to the ground voltage, a first node of the capacitor C2 is coupled to the pad N1, a second node of the capacitor C2 is coupled to the ground voltage.

Figure 8:
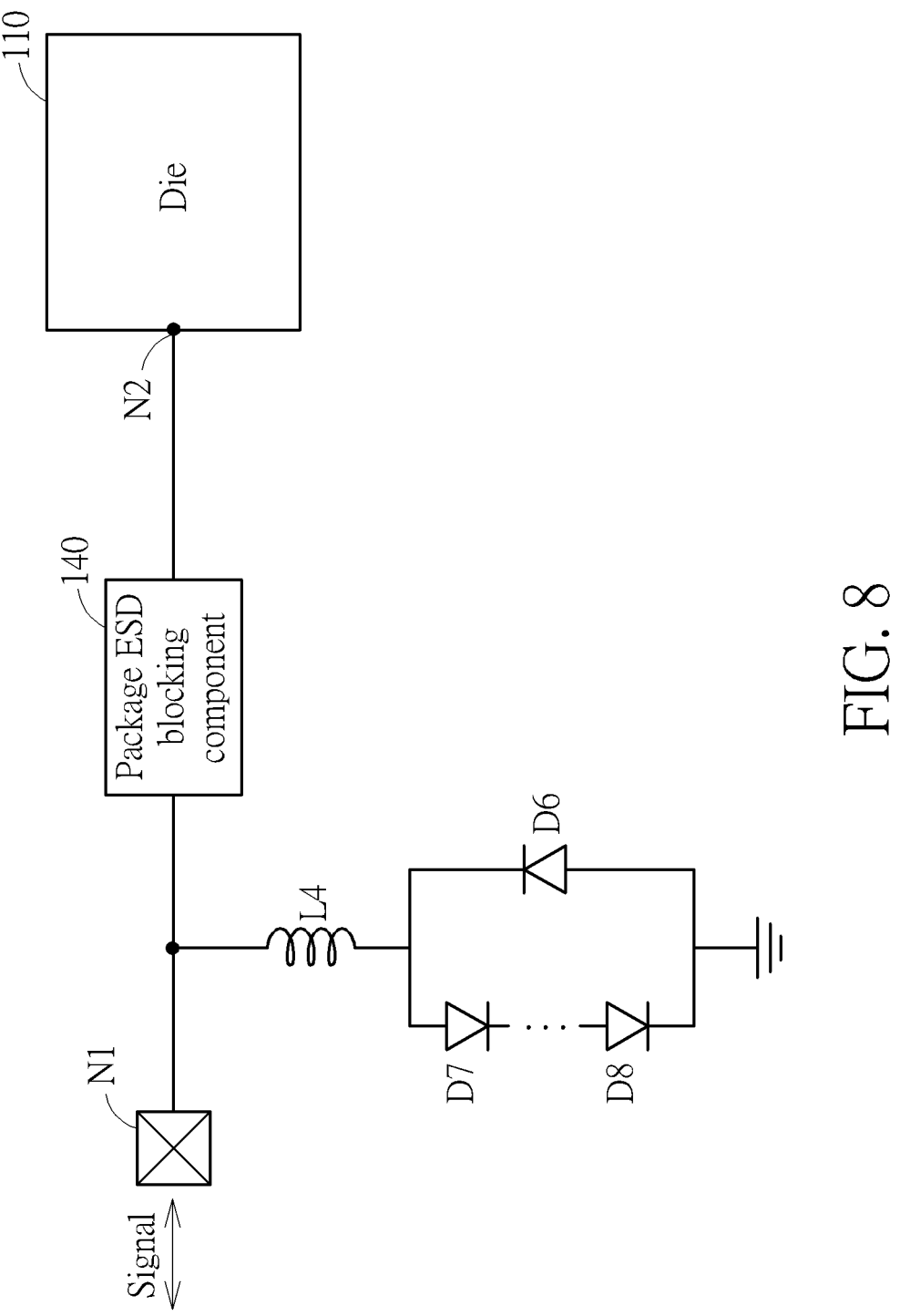
FIG. 8 is a diagram illustrating the package ESD components according to a seventh embodiment of the present invention.

FIG. 8 is a diagram illustrating the package ESD components according to a seventh embodiment of the present invention. As shown in FIG. 8, the package 100 comprises the package ESD conducting component 130 and the package ESD blocking component 140. The package ESD conducting component 130 is implemented by using an inductor L4, forward diode(s) D7 and D8 and reverse diode(s) D6. A first node of the inductor L4 is coupled to the pad N1, an anode of the diode D3 is coupled to the ground voltage, and a cathode of the diode D3 is coupled to a second node of the inductor L4. The diodes D4 and D5 are connected in series, wherein an anode of the diode D4 is coupled to the second node of the inductor L4, and a cathode of the diode D5 is coupled to the ground voltage.

Figure 9:
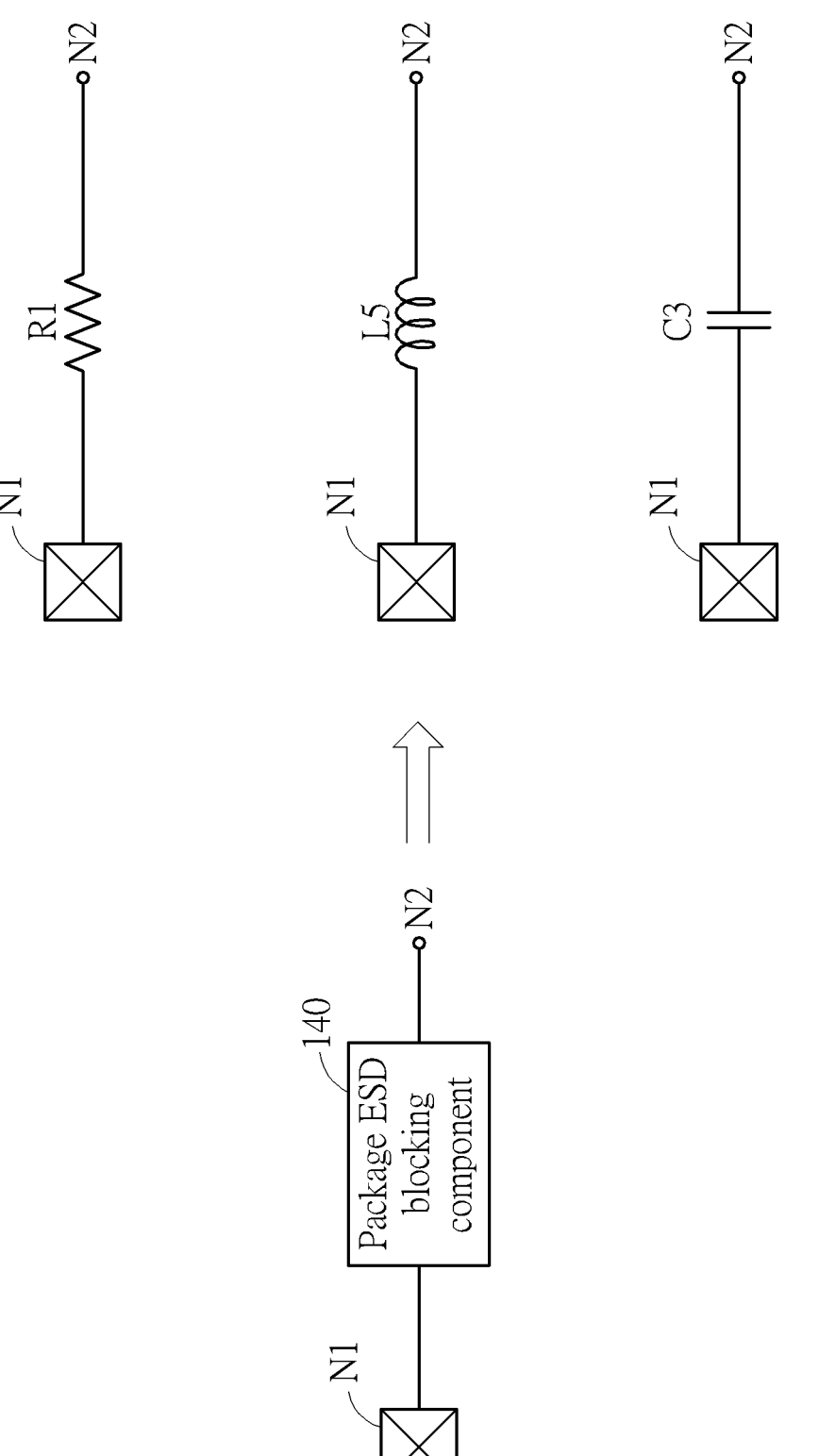
FIG. 9 is a diagram showing some embodiments of the package ESD blocking component.

FIG. 9 is a diagram showing some embodiments of the package ESD blocking component 140 coupled between the pad N1 and the pad N2. As shown in FIG. 9, the package ESD blocking component 140 can be implemented by using a resistor R1, an inductor L5 or a capacitor C3, wherein a first node of the resistor R1, the inductor L5 or the capacitor C3 is coupled to the pad N1, and a second node of the resistor R1, the inductor L5 or the capacitor C3 is coupled to the pad N2.

Figure 10:
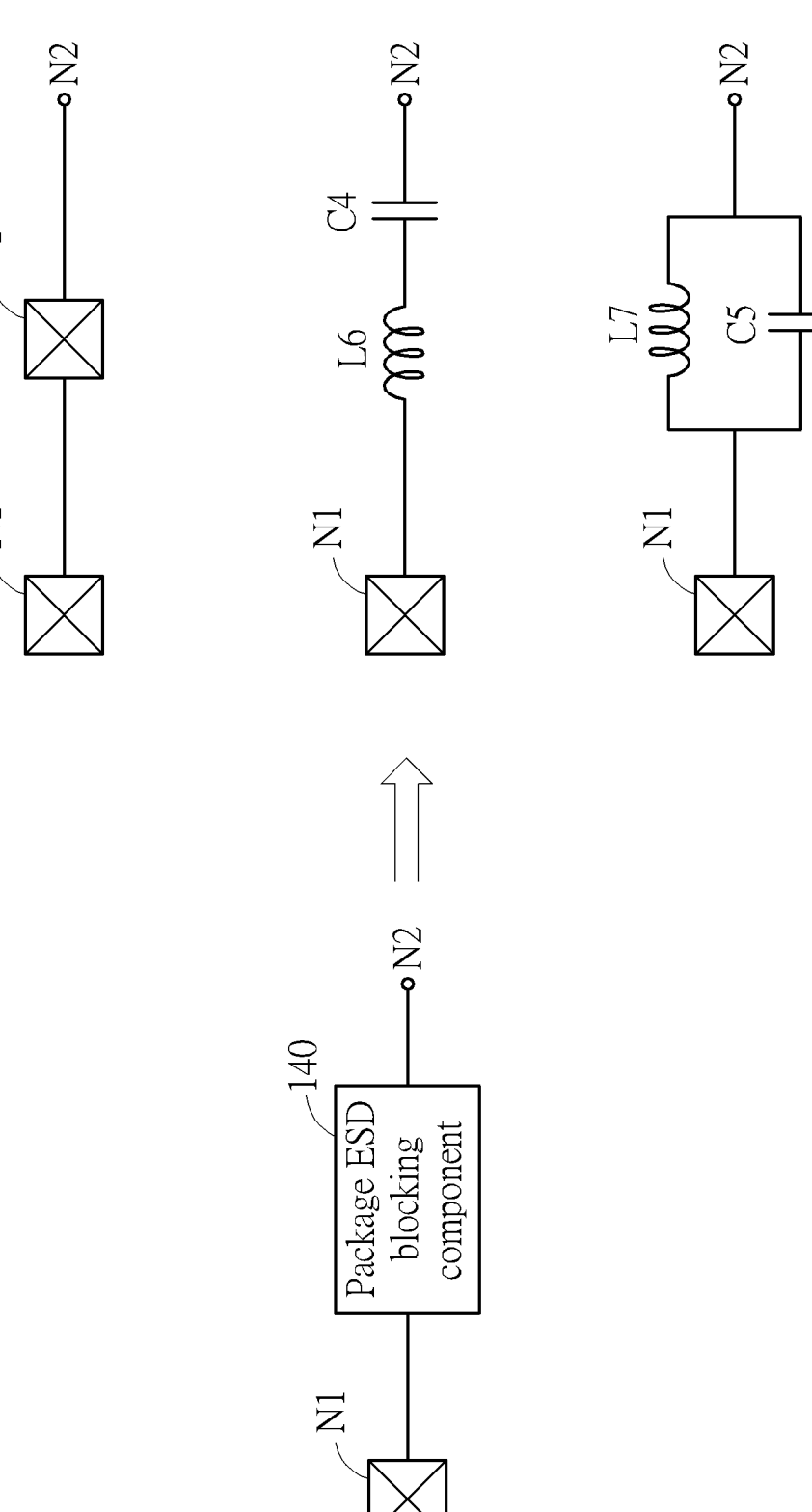
FIG. 10 is a diagram showing some embodiments of the package ESD blocking component.

FIG. 10 is a diagram showing some embodiments of the package ESD blocking component 140 coupled between the pad N1 and the pad N2. As shown in FIG. 9, the package ESD blocking component 140 can be implemented by using via hole, wherein the via hole is manufactured by a plurality of metal layers. The package ESD blocking component 140 can be implemented by using an inductor L6 and a capacitor C4 connected in series, wherein a first node of the inductor L6 is coupled to the pad N1, a second node of the inductor L6 is coupled to a first node of the capacitor C4, and a second node of the capacitor C4 is coupled to the pad N2. The package ESD blocking component 140 can be implemented by using an inductor L7 and a capacitor C5 connected in parallel, wherein a first node of the inductor L7 is coupled to the pad N1, a second node of the inductor L7 is coupled to the pad N2, a first node of the capacitor C5 is coupled to the pad N1, and a second node of the capacitor C5 is coupled to the pad N2.

Figure 11:
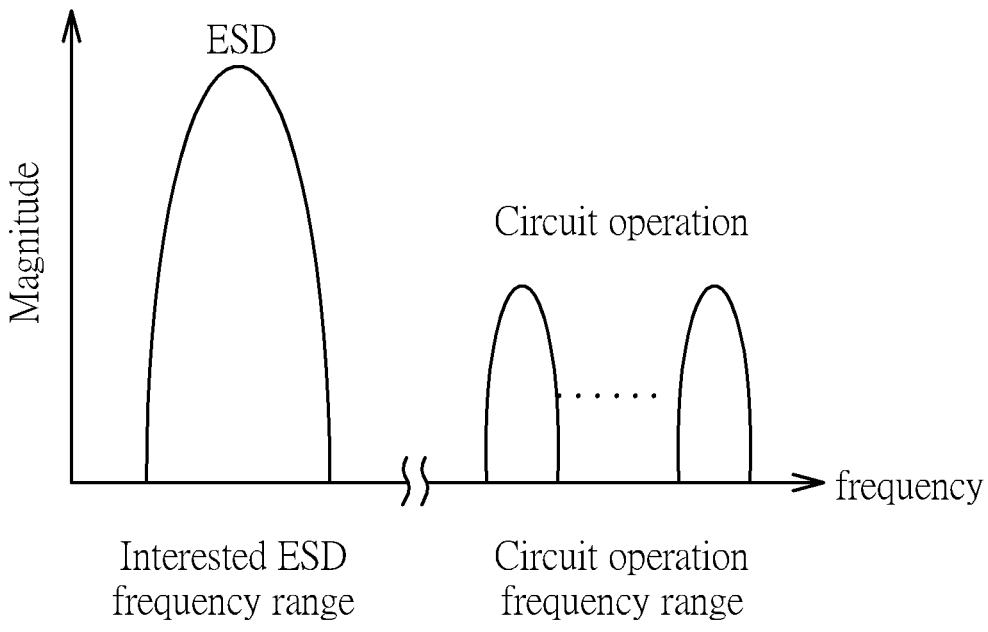
FIG. 11 is a diagram of using the inductor to implement the package ESD conducting component when the die comprises a circuit for processing signals according to one embodiment of the present invention.
Figure 11:
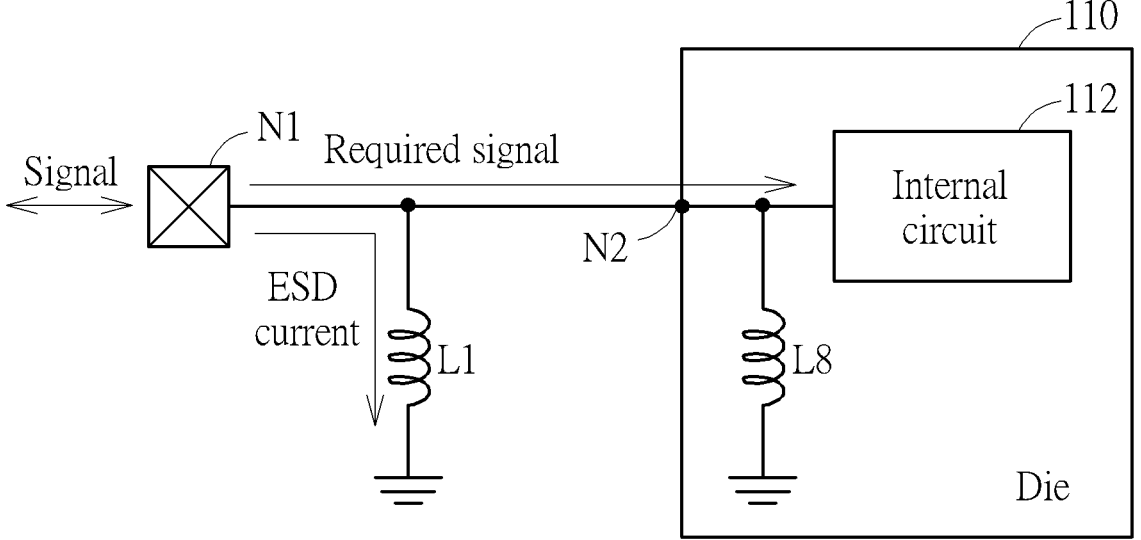

In one embodiment, when the die 110 comprises a circuit for processing a signal, the package ESD conducting component 130 can be implemented by using the inductor L1 shown in FIG. 2 to bypass the ESD current. As shown in FIG. 11, the ESD frequency is within a lower frequency range, a frequency of required signal is within a higher frequency range, the inductor L1 serves as a high-pass filter to bypass the ESD current to the ground, and the high-frequency component can enter the pad N2 of the die 110. In addition, the die ESD component 116 within the die 110 can also be implemented by using an inductor L8, to bypass the remaining ESD current to the ground.

In one embodiment, the die comprises an RF circuit for processing a millimeter wave (mmW) signal, the ESD frequency may be ranging from 100 MHz to 6 GHz, and a frequency of the required millimeter wave signal is ranging from 24 GHz to 40 GHz.

Figure 12:
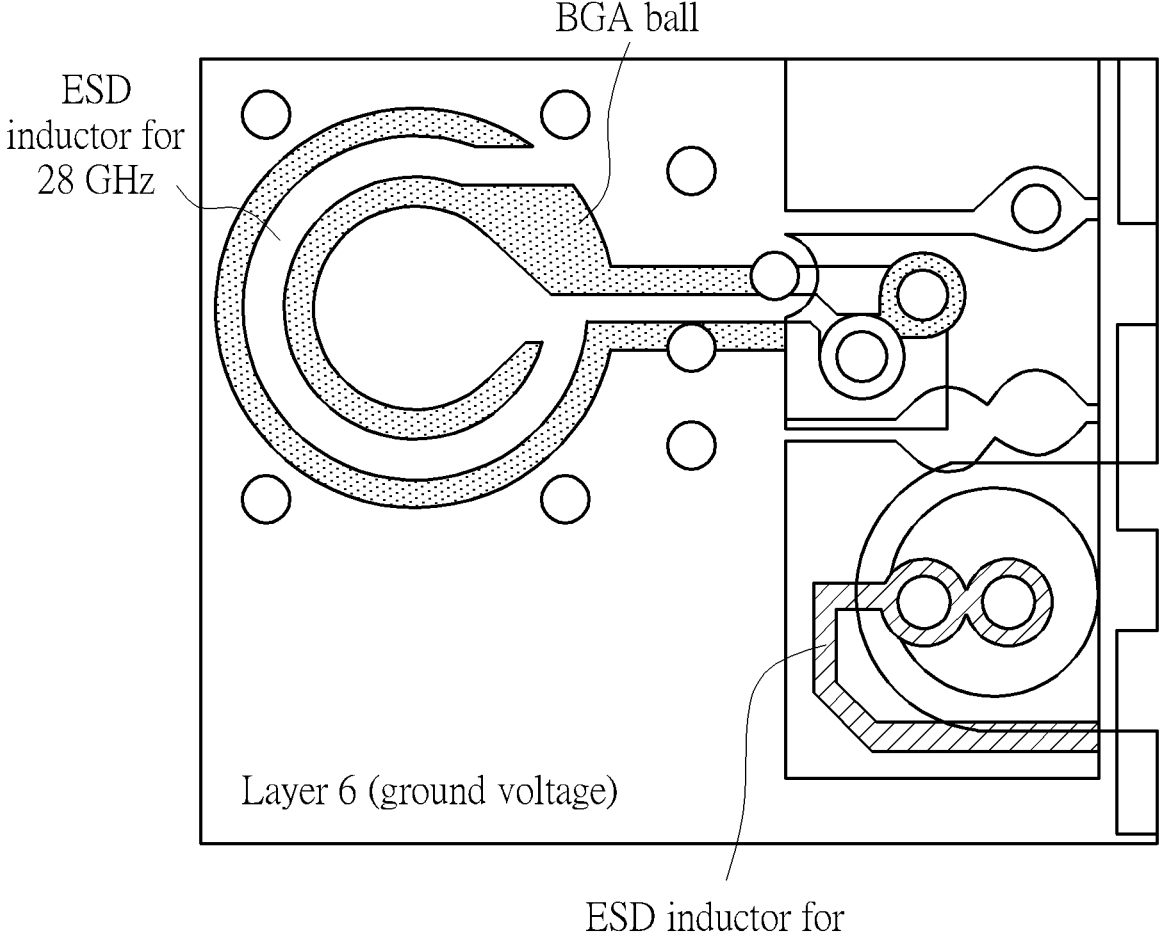
FIG. 12 is a diagram illustrating the designs of the inductor shown in FIG. 11 according to one embodiment of the present invention.

In the embodiment shown in FIG. 11, the inductor L1 can have different designs for different frequencies. Taking FIG. 12 as an example, not a limitation of the present invention, when the pad N1 is used to receive or transmit the millimeter wave signal with 28 GHz, the inductor L1 can be formed by using a sixth metal layer having the ground voltage around a BGA ball; and when the pad N1 is used to receive or transmit the millimeter wave signal with 39 GHz, the inductor L1 can be formed by using a fifth metal layer in keep-out zone.

Figure 13:
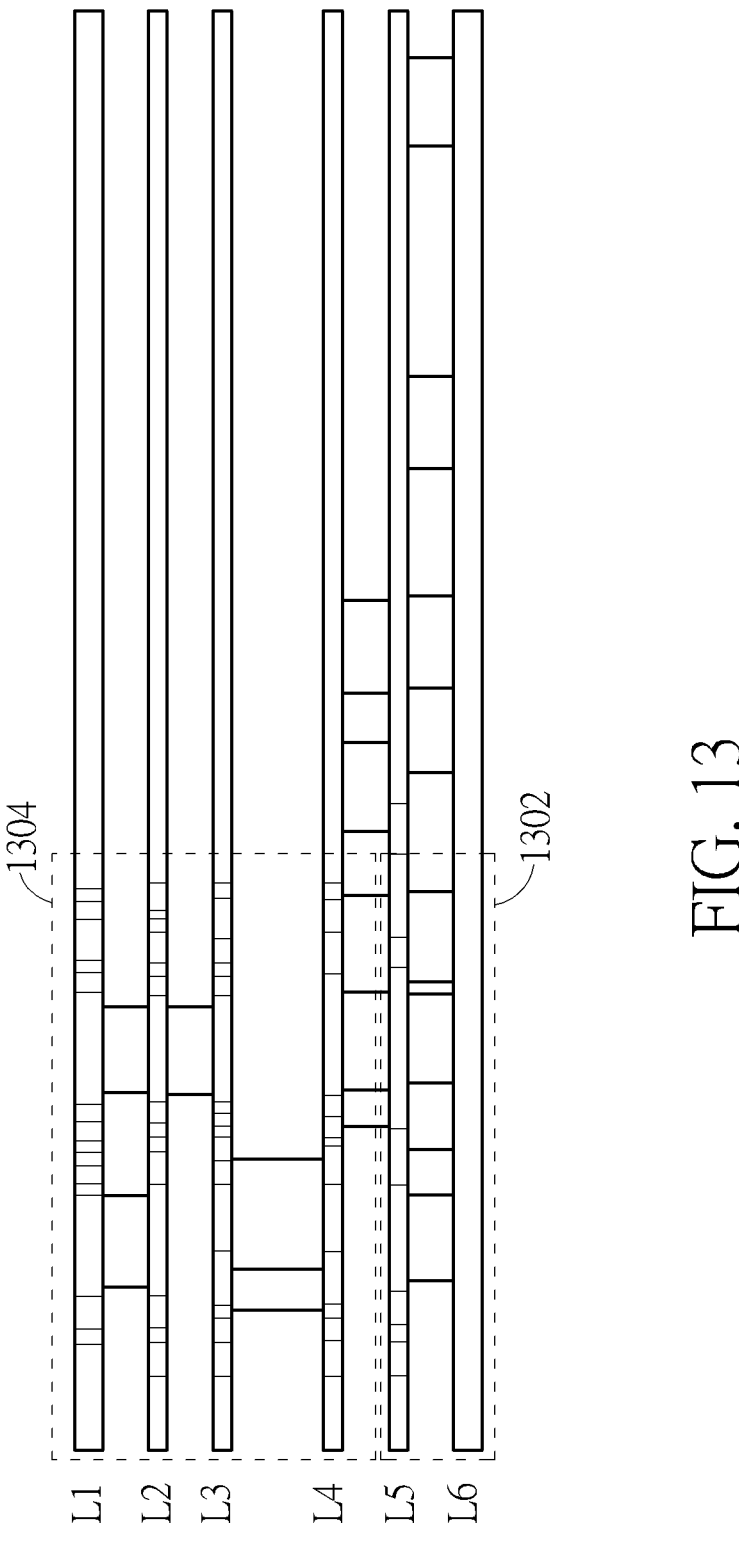
FIG. 13 is a diagram illustrating a vertical cross-sectional view of the circuit connected to the BGA ball.

FIG. 13 is a diagram illustrating a vertical cross-sectional view of the circuit connected to the BGA ball. As shown in FIG. 1, the circuits comprise a first component 1302 and a second component 1304, wherein the first component 1302 can be the package ESD conducting component formed by using the fifth metal layer L5 and the sixth metal layer 6, and the second component 1304 can be the package ESD blocking component formed by using a first metal layer to a fourth metal layer L1-L4.

Briefly summarized, in the embodiments of the present invention, by designing one or more package-level ESD component(s) between the die and the pad(s) of the package, most of the ESD current can be bypassed outside the die, and the remaining ESD current flowing into the die will only induce small voltage drop. In addition, because the package ESD components with lower parasitic effects have better quality factor control and ESD robustness, the package with the package ESD components will have better performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package, comprising: a first pad, configured to receive a signal from a device external to the package or transmit a signal from an internal circuit to the device external to the package; a die comprising a second pad and the internal circuit, wherein the internal circuit is configured to receive the signal from the first pad via the second pad or transmit the signal to the first pad via the second pad; and at least one package electrostatic discharge (ESD) component, wherein the at least one package ESD component is positioned outside the die; wherein the at least one package ESD component comprises a package ESD conducting component coupled between the first pad and a ground voltage; wherein the signal is an analog or digital or RF signal, the package ESD conducting component serves as a high-pass filter to bypass an ESD current, and the die comprises a circuit configured to process the analog or digital or RF signal.

2. A package, comprising:
a first pad, configured to receive a signal from a device external to the package or transmit a signal from an internal circuit to the device external to the package;
a die comprising a second pad and the internal circuit, wherein the internal circuit is configured to receive the signal from the first pad via the second pad or transmit the signal to the first pad via the second pad; and
at least one package electrostatic discharge (ESD) component, wherein the at least one package ESD component is positioned outside the die;
wherein the at least one package ESD component comprises a package ESD conducting component coupled between the first pad and a ground voltage;
wherein the package ESD conducting component comprises an inductor and a capacitor connected in series.

3. A package, comprising:
a first pad, configured to receive a signal from a device external to the package or transmit a signal from an internal circuit to the device external to the package;
a die comprising a second pad and the internal circuit, wherein the internal circuit is configured to receive the signal from the first pad via the second pad or transmit the signal to the first pad via the second pad; and
at least one package electrostatic discharge (ESD) component, wherein the at least one package ESD component is positioned outside the die;
wherein the at least one package ESD component comprises a first package ESD conducting component and a second package ESD conducting component, the first package ESD conducting component is coupled between a supply voltage and the first pad, and the second package ESD conducting component is coupled between a ground voltage and the first pad.

4. The package of claim 3, wherein each of the first package ESD conducting component and the second package ESD conducting component is a diode.

5. The package of claim 3, wherein the first package ESD conducting component is a P-type transistor, and the second package ESD conducting component is an N-type transistor.

6. A package, comprising:
a first pad, configured to receive a signal from a device external to the package or transmit a signal from an internal circuit to the device external to the package;
a die comprising a second pad and the internal circuit, wherein the internal circuit is configured to receive the signal from the first pad via the second pad or transmit the signal to the first pad via the second pad; and
at least one package electrostatic discharge (ESD) component, wherein the at least one package ESD component is positioned outside the die;
wherein the at least one package ESD component comprises a package ESD blocking component coupled between the first pad and the second pad.

7. The package of claim 6, wherein the package ESD blocking component comprises a resistor, an inductor or a capacitor coupled between the first pad and the second pad.

8. The package of claim 6, wherein the package ESD blocking component comprises an inductor and a capacitor, and the inductor and the capacitor are connected in series or parallel.

* * * * *